United States Patent
Nishiguchi et al.

(10) Patent No.: US 8,625,646 B2
(45) Date of Patent: Jan. 7, 2014

(54) SEMICONDUCTOR DEVICE

(75) Inventors: Harumi Nishiguchi, Tokyo (JP); Misao Hironaka, Tokyo (JP); Kyosuke Kuramoto, Tokyo (JP); Masatsugu Kusunoki, Tokyo (JP); Yosuke Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 198 days.

(21) Appl. No.: 13/012,840

(22) Filed: Jan. 25, 2011

(65) Prior Publication Data

US 2011/0249694 A1   Oct. 13, 2011

(30) Foreign Application Priority Data

Apr. 7, 2010   (JP) .................. 2010-088912

(51) Int. Cl.
*H01S 5/024* (2006.01)
*H01S 5/022* (2006.01)

(52) U.S. Cl.
USPC ........................... 372/36; 372/43.01

(58) Field of Classification Search
USPC ................. 372/36, 43.01
See application file for complete search history.

(56) References Cited

U.S. PATENT DOCUMENTS

| | | | | |
|---|---|---|---|---|
| 7,045,827 B2 * | 5/2006 | Gallup et al. | | 257/98 |
| 7,053,492 B2 | 5/2006 | Takahashi et al. | | |
| 7,257,138 B2 * | 8/2007 | Sato et al. | | 372/36 |
| 2006/0002444 A1 * | 1/2006 | Wang et al. | | 372/50.1 |
| 2008/0237814 A1 | 10/2008 | Bayan | | |

FOREIGN PATENT DOCUMENTS

| | | |
|---|---|---|
| CN | 1574319 A | 2/2005 |
| CN | 101276798 A | 10/2008 |
| JP | 59-121989 A | 7/1984 |
| JP | 60-239086 A | 11/1985 |
| JP | 2-253690 A | 10/1990 |
| JP | 3-217065 A | 9/1991 |
| JP | 4-315486 A | 11/1992 |
| JP | 5-110203 A | 4/1993 |
| JP | 5-67033 U | 9/1993 |
| JP | 6-37403 A | 2/1994 |
| JP | 6-260723 A | 9/1994 |
| JP | 6-350202 A | 12/1994 |
| JP | 7-38208 A | 2/1995 |
| JP | 11-284098 A | 10/1999 |

(Continued)

OTHER PUBLICATIONS

State Intellectual Property Office of the People'S Republic of China, Chinese Office Action in Chinese Patent Application 201110085019.7 (Jan. 6, 2013).

(Continued)

*Primary Examiner* — Jessica Stultz
*Assistant Examiner* — Michael Carter
(74) *Attorney, Agent, or Firm* — Leydig, Voit & Mayer, Ltd.

(57) ABSTRACT

A semiconductor device includes a submount; a semiconductor laser mounted on the submount via solder in a junction-down manner. The semiconductor laser includes a semiconductor substrate, a semiconductor laminated structure containing a p-n junction, on the semiconductor substrate, and an electrode on the semiconductor laminated structure and joined to the submount via the solder. A high-melting-point metal or dielectric film is located between the submount and the semiconductor laminated structure and surrounds the electrode.

3 Claims, 10 Drawing Sheets

(56) References Cited

FOREIGN PATENT DOCUMENTS

| JP | 2000-4064 A | 1/2000 |
| JP | 2002-359427 A | 12/2002 |
| JP | 2007-103804 A | 4/2007 |

OTHER PUBLICATIONS

State Intellectual Property Office of the People'S Republic of China, Office Action in Chinese Patent Application No. 2011100850197 (Aug. 12, 2013).

* cited by examiner

SEMICONDUCTOR DEVICE

BACKGROUND OF THE INVENTION

1. Field of the Invention

The present invention relates to a semiconductor device and method for manufacturing the same wherein a semiconductor laser is mounted on a submount via a solder in a junction-down manner, and in particular to a semiconductor device and method for manufacturing the same capable of securing higher dissipation characteristics and improving the yield.

2. Background Art

A semiconductor laser is mounted on a submount via a solder in a junction-up manner or a junction-down manner. When the chip width is shrunk for cost saving, the space for wire bonding avoiding contact with the light-emitting stripes is lost if the junction-up manner is used. Therefore, the junction-down manner is generally used (for example, refer to Japanese Patent Laid-Open No. 5-110203). In addition, since the junction-down manner has favorable heat dissipation characteristics, the properties of the chip at high power and/or high temperature can be improved.

SUMMARY OF THE INVENTION

Due to compressing for mounting, the solder spreads outward and runs out to the side of the chip, and builds up along the side surface of the chip. When the junction-up manner is used, since the p-n junction of the semiconductor laser is remote from the mounting surface, the p-n junction is not short-circuited with the solder. However, when the junction-down manner is used, a problem wherein the p-n junction is short-circuited with the solder to lower the yield is caused.

In GaN-based semiconductor lasers, since the crystal growing speed is low, and for reducing the heat damage to the active layer, the total thickness of the upper clad layer on the active layer and the contact layer is generally less than 1 μm. This thickness is thinner than the total thickness of the GaAs-based semiconductor laser and the like of 3 to 5 μm. Therefore, since the distance from the mounting surface to the p-n junction is short in the case of the GaN-based semiconductor laser, the above-described problem is particularly significant.

In addition, it is considered to surround the electrode with an insulating film between the submount and the semiconductor laser so as to prevent the solder to wrap around the side surface of the semiconductor laser. However, since the heat dissipation of the insulating film is low, heat generated in the light-emitting region of the semiconductor laser cannot be sufficiently dissipated into the submount.

In view of the above-described problems, an object of the present invention is to provide a semiconductor device and method for manufacturing the same capable of securing higher dissipation characteristics and improving the yield.

According to the present invention, a semiconductor device comprises: a submount; a semiconductor laser mounted on the submount via a solder in a junction-down manner and including a semiconductor substrate, a semiconductor laminated structure containing a p-n junction on the semiconductor substrate, and an electrode on the semiconductor laminated structure and joined to the submount via the solder; and a high-melting-point metal film or a high-melting-point dielectric film placed between the submount and the semiconductor laminated structure and surrounding the electrode.

The present invention makes it possible to secure higher dissipation characteristics and improve the yield.

Other and further objects, features and advantages of the invention will appear more fully from the following description.

DETAILED DESCRIPTION OF THE PREFERRED EMBODIMENTS

Figure 1:
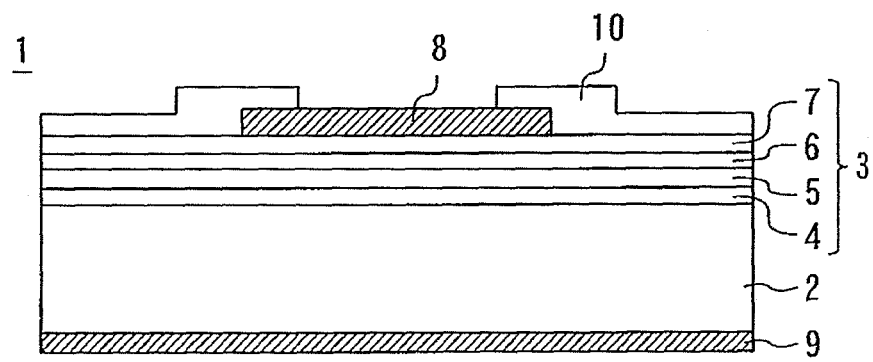
FIG. 1 is a sectional view showing a semiconductor laser 1 according to the first embodiment.

A semiconductor device according to the embodiments of the present invention will be described referring to the drawings. The same components will be denoted by the same symbols, and the repeated descriptions may be omitted.

First Embodiment

FIG. 1 is a sectional view showing a semiconductor laser 1 according to the first embodiment. A semiconductor laminated structure 3 containing a p-n junction is formed on an n-type GaN substrate 2 (semiconductor substrate). The semiconductor laminated structure 3 has an n-type Al.GaN clad layer 4, an InGaN active layer 5, a p-type AlGaN clad layer 6, and a p-type GaN contact layer 7 sequentially laminated from the n-type GaN substrate 2 side. An electrode 8 is formed on the upper surface of the p-type GaN contact layer 7, and an electrode 9 is formed on the lower surface of the n-type GaN substrate 2. Gold (Au) is contained in the electrodes 8 and 9.

A high-melting-point metal film 10 is placed so as to surround the electrode 8. The high-melting-point metal film 10 is composed of platinum (Pt), nickel (Ni), nickel chromium alloy (NiCr), tungsten (W), titanium (T), tungsten-titanium (TiW), molybdenum (Mo), tantalum (Ta), or niobium (Nb). In place of the high-melting-point metal film 10, a high-melting-point dielectric film composed of an oxide or nitride film of the material of the above-described high-melting-point metal film 10.

Figure 2:
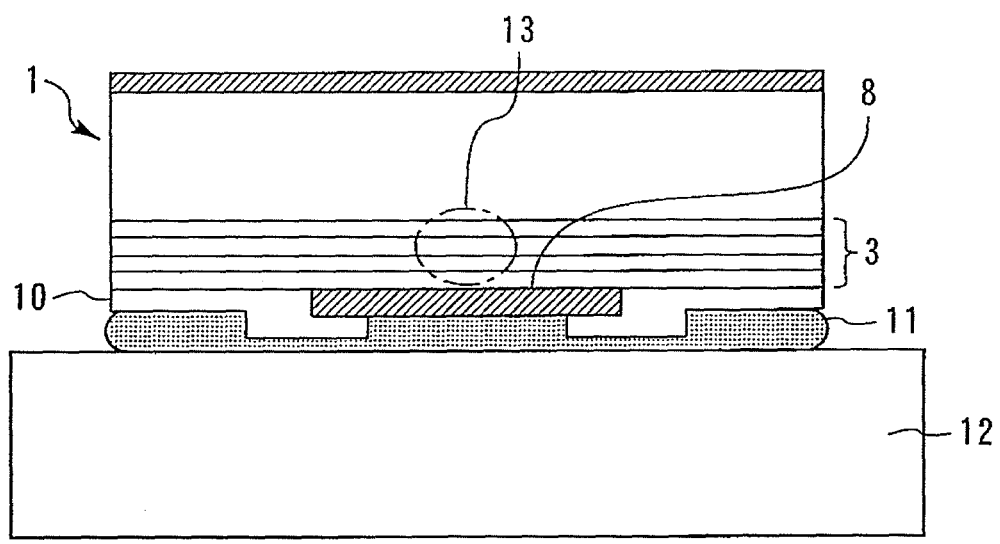
FIG. 2 is a sectional view showing a semiconductor device according to the first embodiment.

FIG. 2 is a sectional view showing a semiconductor device according to the first embodiment. The semiconductor laser 1 is mounted on the submount 12 via a solder 11 in a junction-down manner. The electrode 8 of the semiconductor laser 1 is joined to the submount 12 via the solder 11. The solder 11 is composed of a material that forms Au—Sn-based, Sn—Ag-based, Sn—Ag—Cu-based, Sn—Zn-based, Sn—Bi-based, Pb—Sn-based, Au—Si-based, and Au—Ge-based alloys.

As described above, in the present embodiment, the high-melting-point metal film 10 or the high-melting-point dielectric film is placed so as to surround the electrode 8 between the submount 12 and the semiconductor laminated structure 3. Since the solder 11 is prevented from wrapping around the side surface of the semiconductor laser 1 to cause the short-circuiting of the p-n junction by the high-melting-point metal film 10 or the high-melting-point dielectric film, the yield can be improved.

Furthermore, the high-melting-point metal film 10 and the high-melting-point dielectric film have about 10 times higher thermal conductivity than the insulating film. The thermal conductivity of high-melting-point metals is 50 to 200 W/m·K, whereas the thermal conductivity of $SiO_2$ and SiN, which are materials for general insulating films, is 10 W/m·K or lower and 20 W/m·K or lower, respectively.

Heat generated in the light-emitting region 13 of the semiconductor laser 1 is dissipated into the submount 12 via the electrode 8, the high-melting-point metal film 10, and the solder 11. When the electrode 8 is surrounded by the high-melting-point metal film 10 or the high-melting-point dielectric film according to the present embodiment, higher dissipation characteristics can be secured comparing to the case wherein the electrode 8 is surrounded by the insulating film. This is particularly advantageous in semiconductor lasers wherein several hundreds of milliwatts or more high power is required, or semiconductor lasers whose operation current and voltage are high.

Second Embodiment

Figure 3:
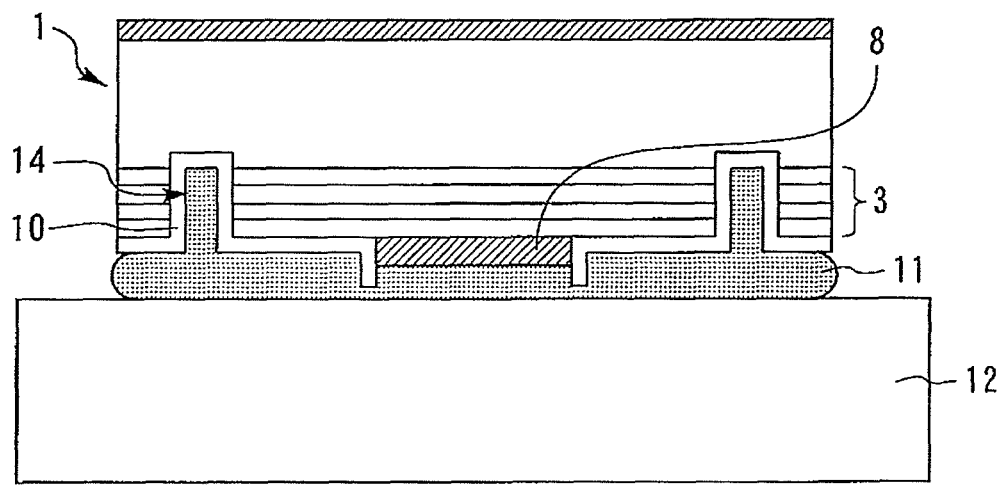
FIG. 3 is a sectional view showing a semiconductor device according to the second embodiment.

FIG. 3 is a sectional view showing a semiconductor device according to the second embodiment. In a semiconductor laminated structure 3, a channel 14 is formed so as to surround the electrode 8. The inside of the channel 14 is coated with a high-melting-point metal film 10 or a high-melting-point dielectric film. However, the high-melting-point metal film 10 is not ohmically joined to the semiconductor laminated structure 3. Other configurations are identical to the configurations of the first embodiment.

During mounting, an excessive solder 11 can be flowed into the channel 14. Therefore, since the solder 11 is prevented from wrapping around the side surface of the semiconductor laser 1 to cause the short-circuiting by the p-n junction, the yield can be improved.

The width of the channel 14 is 30 μm or smaller, preferably, 5 to 20 μm. The depth of the channel 14 is about 1 to 10 μm deeper than the depth of p-n junction. Thereby, the volume of the channel 14 where excessive solder 11 flows in can be enlarged.

The location of the channel 14 is 5 to 30 μm inside, preferably 5 to 20 μm from the end of the semiconductor laser 1. By thus making the channel 14 close to the end of the chip, the bonding width can be increased and adhesion strength can be secured even when the width of the semiconductor laser 1 is shrunk to 150 μm or less, for example, nearly 100 μm.

Third Embodiment

Figure 4:
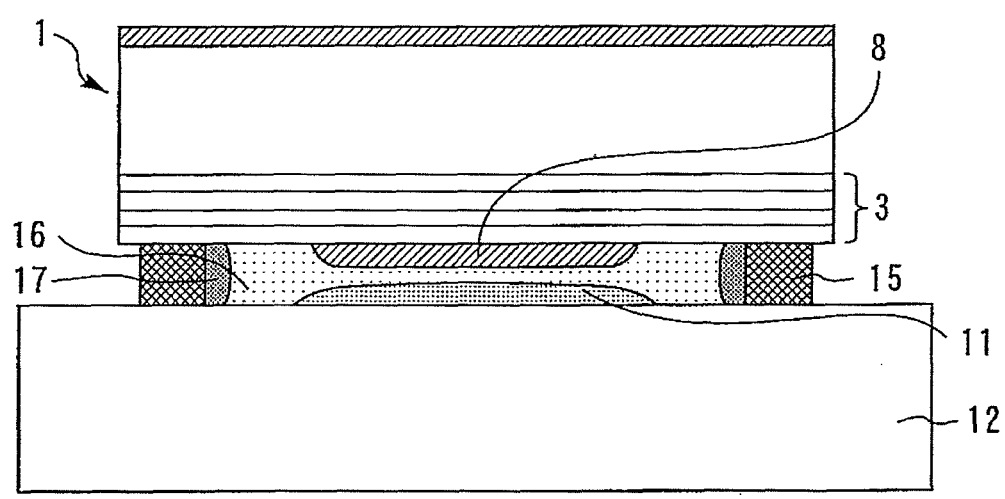
FIG. 4 is a sectional view showing a semiconductor device according to the third embodiment.

FIG. 4 is a sectional view showing a semiconductor device according to the third embodiment. In place of the high-melting-point metal film 10 in the first embodiment, a metal pad 15 is placed between the submount 12 and the semiconductor laminated structure 3 so as to surround the electrode 8. The metal pad 15 contains gold (Au). The solder 11 is an Au—Sn solder composed of 80% by weight of Au and 20% by weight of Sn. The melting point of the solder 11 is 280° C.

Figure 5:
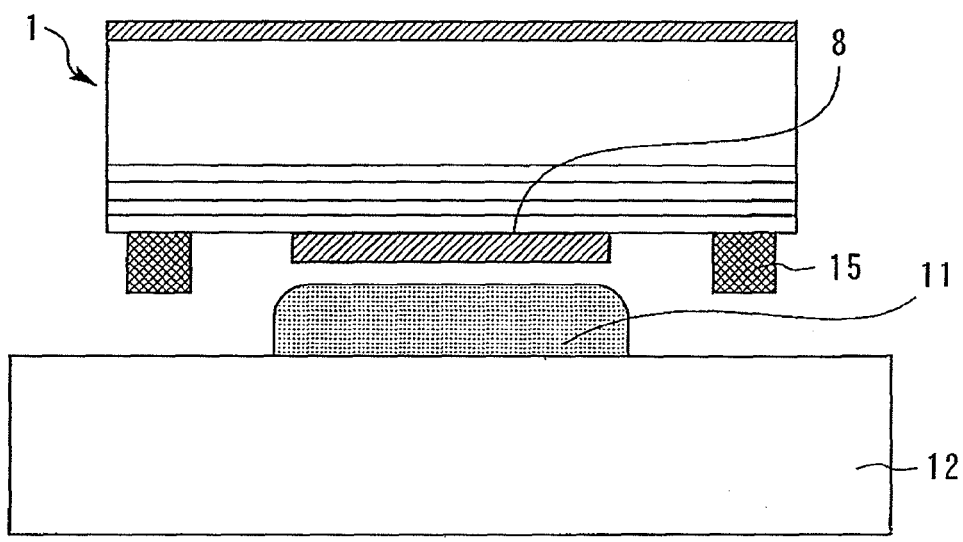
FIG. 5 is a sectional view for illustrating a method for manufacturing a semiconductor device according to the third embodiment.

FIG. 5 is a sectional view for illustrating a method for manufacturing a semiconductor device according to the third embodiment. First, a semiconductor laser 1 containing a p-n junction is prepared. A metal pad 15 is formed on the semiconductor laser 1 so as to surround the electrode 8 of the semiconductor laser 1. A solder 11 is formed on the submount 12. Thereafter, the semiconductor laser 1 is mounted on the submount 12 by the junction-down manner via the solder 11. The mounting temperature when the semiconductor laser 1 is mounted on the submount 12 is about 300 to 350° C. This mounting temperature is higher than the melting point of the solder 11.

Figure 6:
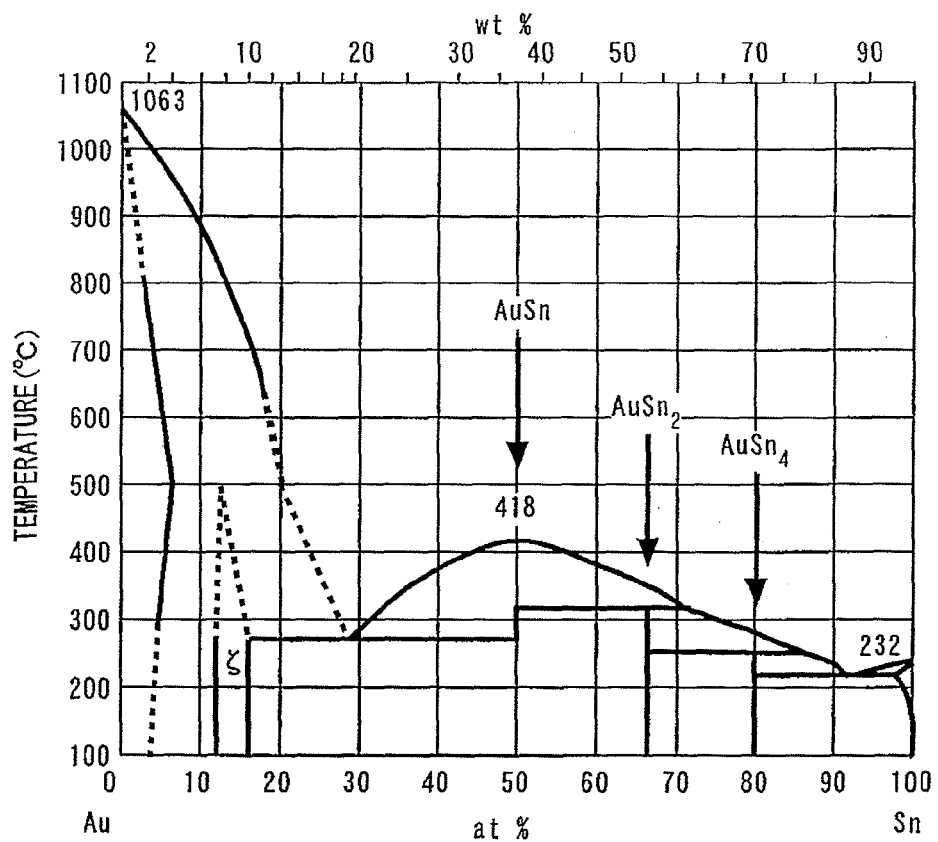
FIG. 6 is an Au—Sn binary phase diagram.

During this mounting, as shown in FIG. 4, Au, which is a component material of the electrode 8 is diffused into the solder 11 to form a first alloy layer 16. FIG. 6 is an Au—Sn binary phase diagram. As shown in FIG. 6, the larger the Au contents, the higher the melting point of the Au—Sn. Therefore, the melting point of the first alloy layer 16 is higher than the melting point of the solder 11.

When the first alloy layer 16 reaches the metal pad 15, Au, which is a component material of the metal pad 15, diffuses into the first alloy layer 16, and the second alloy layer 17 is formed. The second alloy layer 17 is composed of, for example, 85% by weight of Au and 15% by weight of Sn. The melting point of the second alloy layer 17 elevates to about 400° C. Therefore, since the melting point of the second alloy layer 17 is higher than the mounting temperature (about 300 to 350° C.), when the solder 11 reaches the metal pad 15 and becomes the second alloy layer 17, the fusion of the solder 11 is stopped. Therefore, since the solder 11 is prevented from wrapping around the side surface of the semiconductor laser 1 to cause the short-circuiting of the p-n junction, the yield can be improved.

The thickness of the metal pad 15 is set up so that the volume of the space surrounded by the submount 12, the semiconductor laminated structure 3, and the metal pad 15 becomes substantially equal to the volume after the solder 11 becomes alloyed. Specifically, the thickness of the metal pad 15 is about several to 30 percent thinned than the thickness of the solder 11 in FIG. 5.

Since the melting point of the Au—Sn solder is also elevated when the content of Sn is increased, a metal pad 15 containing Sn as a component material may also be used. In such a case, for example, the second alloy layer 17 is composed of 70% by weight of Au and 30% by weight of Sn, the melting point thereof becomes about 390° C. Therefore, an equivalent effect can be obtained.

The solder 11 is not limited to the Au—Sn solder, but may be composed of materials which form Sn—Ag-based, Sn—Ag—Cu-based, Sn—Zn-based, Sn—Bi-based, Pb—Sn-based, Au—Si-based, or Au—Ge-based alloys, whose melting point is changed depending on the component ratios. Then, as the material for the metal pad 15, a material containing a material that elevates the melting point of the solder 11 when alloyed with the solder 11, or added to the solder 11 is used. Thereby, an equivalent effect can be obtained.

Figure 7:
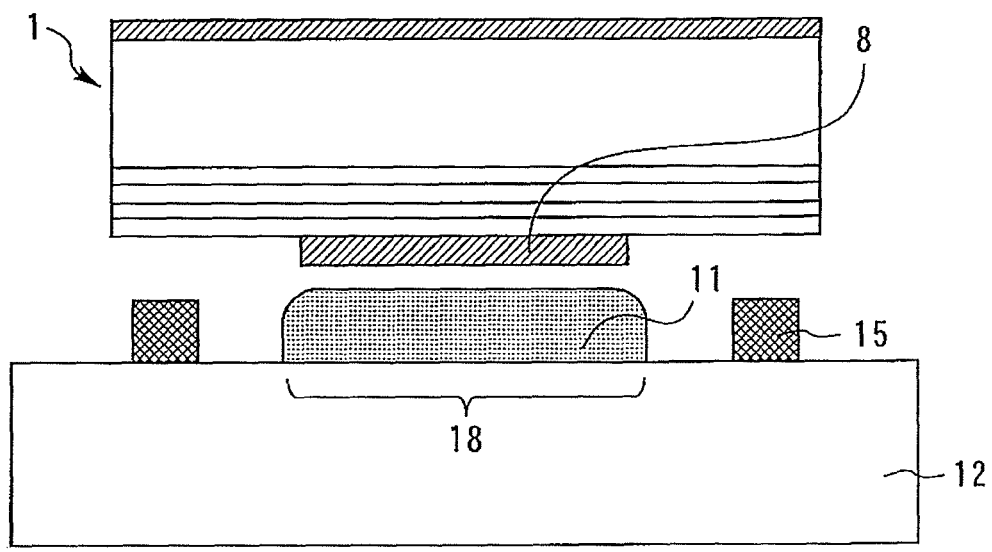
FIG. 7 is a sectional view for illustrating a modification example of the method for manufacturing a semiconductor device according to the third embodiment.

FIG. 7 is a sectional view for illustrating a modification example of the method for manufacturing a semiconductor device according to the third embodiment. In the above-described example, although the metal pad 15 was formed on the semiconductor laser 1, in this modification example, the metal pad 15 is formed so as to surround a joining region 18 on the submount 12. Then, the solder 11 is formed in the joining region 18 on the submount 12. Thereafter, the semiconductor laser 1 is mounted in the joining region 18 on the submount 12 via the solder 11 by junction-down manner. Other processes are identical to the processes in the above-described example, and the equivalent effects can be obtained.

Fourth Embodiment

Figure 8:
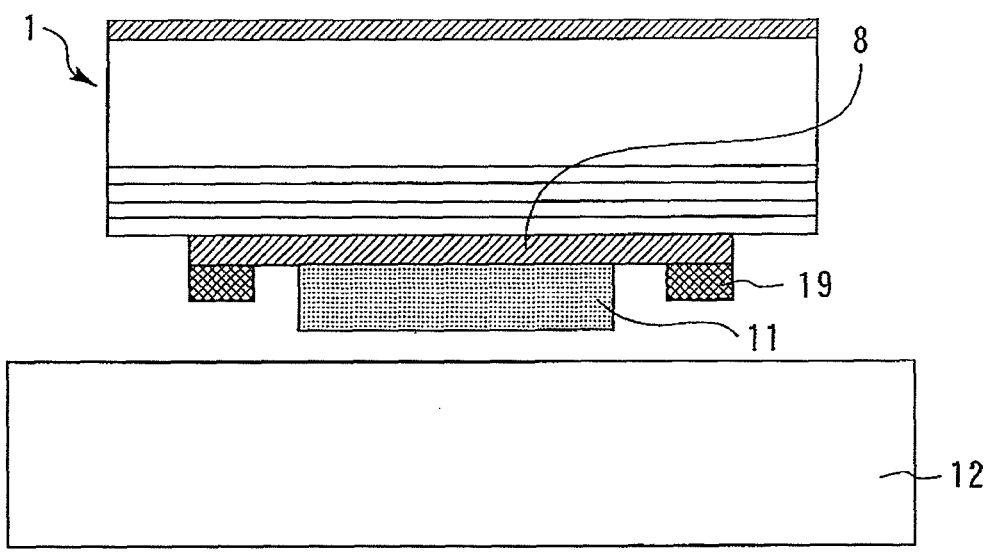
FIG. 8 is a sectional view showing a semiconductor device according to the fourth embodiment.

FIG. 8 is a sectional view showing a semiconductor device according to the fourth embodiment. In place of the high-melting-point metal film 10 in the first embodiment, an Au film 19 (metal film) is placed on the periphery of the electrode 8 between the submount 12 and the electrode 8. The solder 11 is an Au—Sn solder composed of 80% by weight of Au and 20% by weight of Sn. The melting point of the solder 11 is 280° C.

Figure 9:
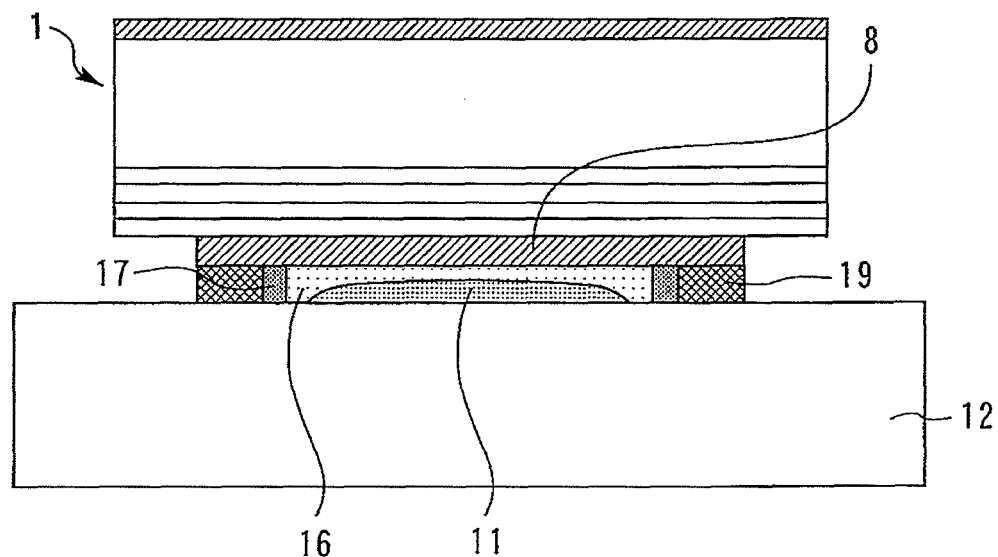
FIG. 9 is a sectional view for illustrating a method for manufacturing a semiconductor device according to the fourth embodiment.

FIG. 9 is a sectional view for illustrating a method for manufacturing a semiconductor device according to the fourth embodiment. First, a semiconductor laser 1 containing a p-n junction is prepared. Then, an Au film 19 is formed on the periphery of the electrode 8 of the semiconductor laser 1. The solder 11 is vapor-deposited in the region surrounded by the Au film 19 on the electrode 8. Thereafter, the semiconductor laser 1 is mounted on the submount 12 via the solder 11 by a junction-down manner. The mounting temperature when the semiconductor laser 1 is mounted on the submount 12 is about 300 to 350° C. This mounting temperature is higher than the melting point of the solder 11.

As shown in FIG. 8, during this mounting, Au, which is the constituting material of the electrode 8, is diffused into the solder 11, and the first alloy layer 16 is formed. When the first alloy layer 16 reaches the Au film 19, Au, which is the constituting material of the Au film 19, is diffused into the first alloy layer 16, and the second alloy layer 17 is formed. The second alloy layer 17 is composed of, for example, 85% by weight of Au and 15% by weight of Sn. The melting point of the second alloy layer 17 is elevated to about 400° C. Therefore, since the melting point of the second alloy layer 17 is higher than the mounting temperature (about 300 to 350° C.), the solder 11 reaches to the Au film 19 to become the second alloy layer 17 to stop the fusion of the solder 11. Therefore, since the solder 11 is prevented from wrapping around the side surface of the semiconductor laser 1 to cause the short-circuiting of the p-n junction, the yield can be improved.

Here, the thickness of the Au film 19 is set up so that the volume of the space surrounded by the submount 12, the electrode 8, and the Au film 19 becomes substantially equal to the volume of the alloyed solder 11. Specifically, the thickness of the Au film 19 is thinned by about several to 30 percent than the thickness of the solder 11 shown in FIG. 9.

Fifth Embodiment

Figure 10:
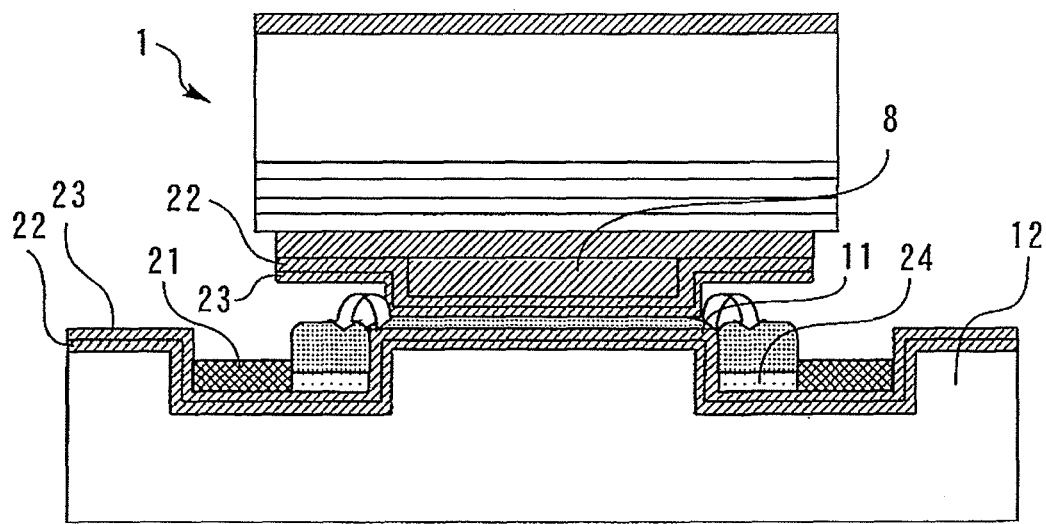
FIG. 10 is a sectional view showing a semiconductor device according to the fifth embodiment.

FIG. 10 is a sectional view showing a semiconductor device according to the fifth embodiment. In place of the high-melting-point metal film 10 in the first embodiment, a channel 20 is formed in the submount 12 so as to surround the electrode 8. An Au layer 21 (metal layer) is formed in the channel 20. The solder 11 is an Sn—Ag solder. An Au-plated layer 22 and a Pt/flash Au layer 23 are formed on the electrode 8 and the submount 12.

Figure 11:
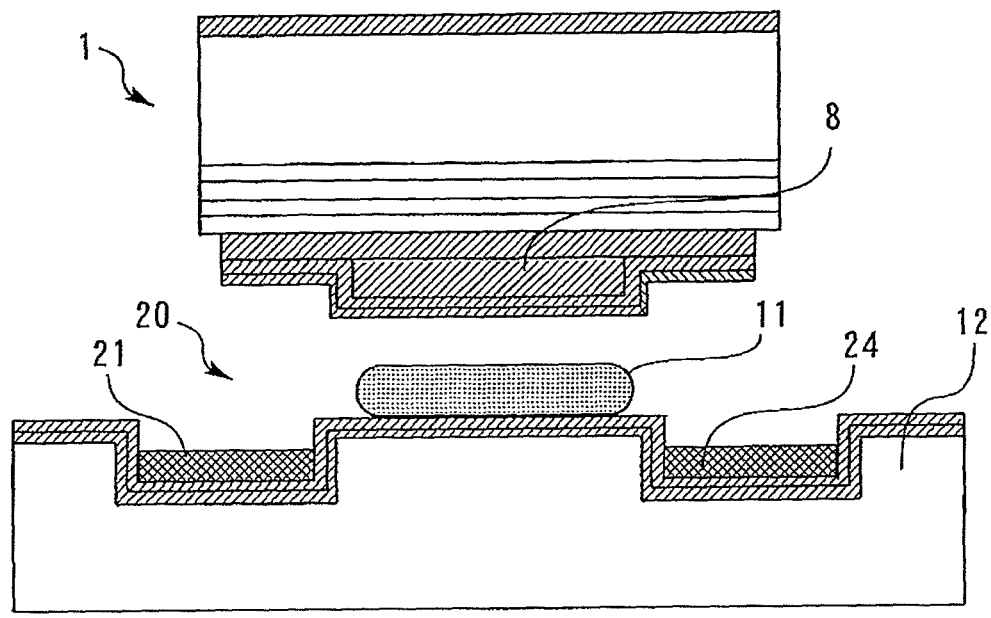
FIG. 11 is a sectional view for illustrating a method for manufacturing a semiconductor device according to the fifth embodiment.

FIG. 11 is a sectional view for illustrating a method for manufacturing a semiconductor device according to the fifth embodiment. First, a semiconductor laser 1 containing a p-n junction is prepared. Next, a channel 20 is formed so as to surround the joining region 18 on the submount 12, and the Au layer 21 is formed in the channel 20. Then, a solder 11 is formed in the joining region 18 on the submount 12. Thereafter, the semiconductor laser 1 is mounted in the joining region 18 on the submount 12 via the solder 11 by junction-down manner. The mounting temperature when the semiconductor laser 1 is mounted on the submount 12 is about 300 to 350° C. This mounting temperature is higher than the melting point of the solder 11.

During mounting, the solder 11 flows in the channel 20 of the submount 12. Thereby, as shown in FIG. 10, Au, which is a constituting material of the Au layer 21, is diffused into the solder 11, and an inter-metal compound 24 is formed. The inter-metal compound 24 is composed of AuSn. The melting point of the solder 11 wherein the inter-metal compound 24 is contained is elevated to, for example, 380° C., which is higher than the mounting temperature (about 300 to 350° C.). Thereby, since the fusion of the solder 11 is stopped, the lateral spreading of the solder 11 in the channel 20 can be suppressed. Therefore, since the solder 11 is prevented from wrapping around the side surface of the semiconductor laser 1 to cause the short-circuiting of the p-n junction, the yield can be improved.

Figure 12:
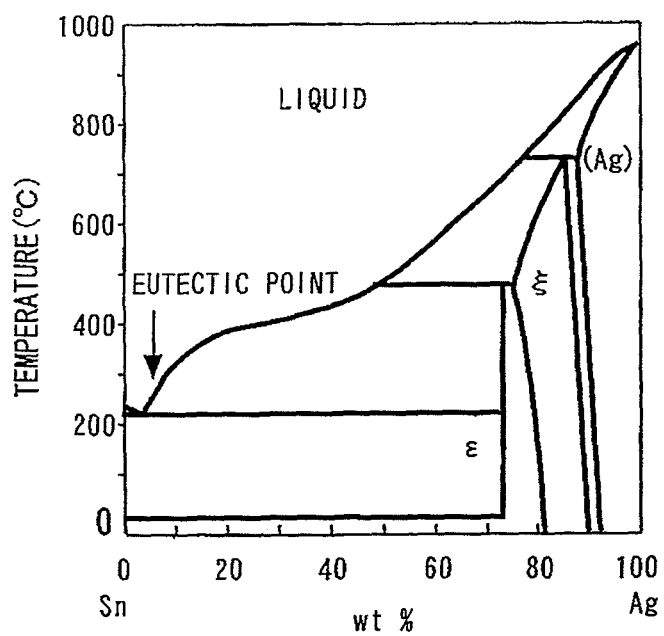
FIG. 12 is the binary phase diagram of SnAg.

FIG. 12 is the binary phase diagram of SnAg. The melting point of SnAg is as low as 221° C. when the content of Ag is 3.5% (eutectic point), and elevates as the content of Ag is increased. Therefore, even if an Ag layer is placed in the channel 20 in place of the Au layer 21, the equivalent effect can be obtained. Also when an Au—Sn solder is used in place of the Sn—Ag solder in the same manner as in the third and fourth embodiments, and an Au layer 21 or Sn layer is placed in the channel 20, the equivalent effect can be obtained. Furthermore, if the other impurity material that elevates the melting point of the solder 11 when mixed in the solder 11 is placed in the channel 20 in place of the Au layer 21, the equivalent effect can also be obtained.

Figure 13:
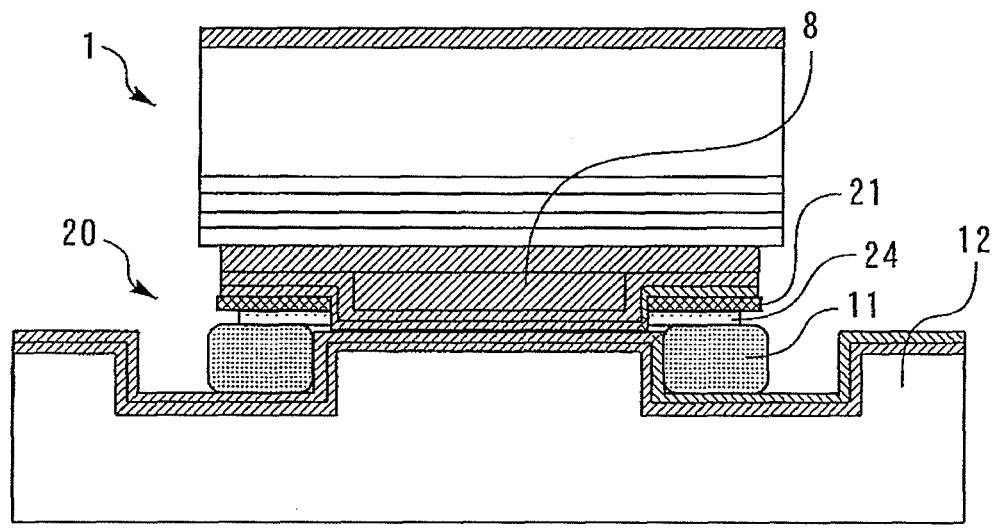
FIG. 13 is a sectional view for illustrating a modification example of a semiconductor device according to the fifth embodiment.

FIG. 13 is a sectional view for illustrating a modification example of a semiconductor device according to the fifth embodiment. An Au layer 21 is not placed in the channel 20 of the submount 12, but placed on the side of the semiconductor laser 1 so as to surround the electrode 8. In this case, the equivalent effect can also be obtained. If Au layers 21 are placed both in the channel 20 of the submount 12 and the side of the semiconductor laser 1, further effects can be obtained.

Sixth Embodiment

Figure 14:
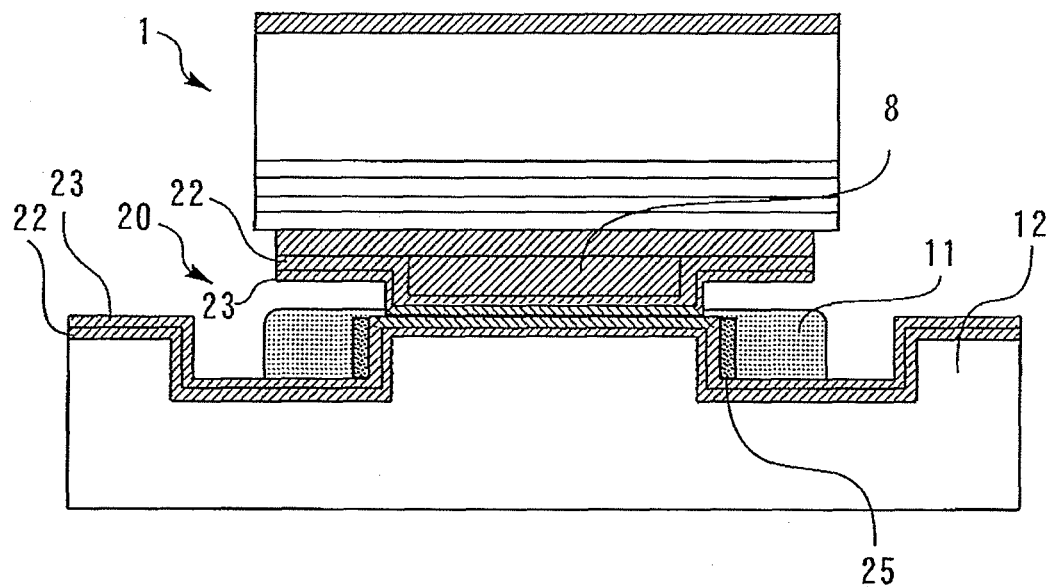
FIG. 14 is a sectional view showing a semiconductor device according to the sixth embodiment.

FIG. 14 is a sectional view showing a semiconductor device according to the sixth embodiment. In place of the high-melting-point metal film 10 in the first embodiment, a channel 20 is formed on the submount 12 so as to surround the electrode 8. An attractive material 25 is formed on the side surface in the channel 20. The attractive material 25 is a material for improving the fluidity of the solder 11. Specifically, the attractive material 25 is a material same to the solder 11, a constituent material of the solder 11, flux (fusing agent), or a metallic material to lower the melting point when alloyed with the solder 11.

Specifically, the flux is the aqueous solution of borax (sodium 4-borate, $Na_2B_4O_5(OH)_4 \cdot 8H_2O$) or zinc chloride ($ZnCl_2$), which has characteristics to solve metal oxides. The metallic material to lower the melting point when alloyed with the solder 11 is specifically Ag for the Sn—Cu solder, Bi for the Sn—Ag—Bi—Cu solder, In for the Sn—Ag solder, and Ag, Al, or Ga for the Sn-9Zn solder. For the Sn-0.75Cu solder (melting point: 227° C.), the melting point of Ag-added Sn-3.5Ag-0.75Cu is 217° C. For the Sn-2.5Ag-1.0Bi-0.5Cu solder (melting point 214° C.), the melting point of Sn-2.0Ag-3.0Bi-0.75Cu having a high Bi content is 207° C.

Figure 15:
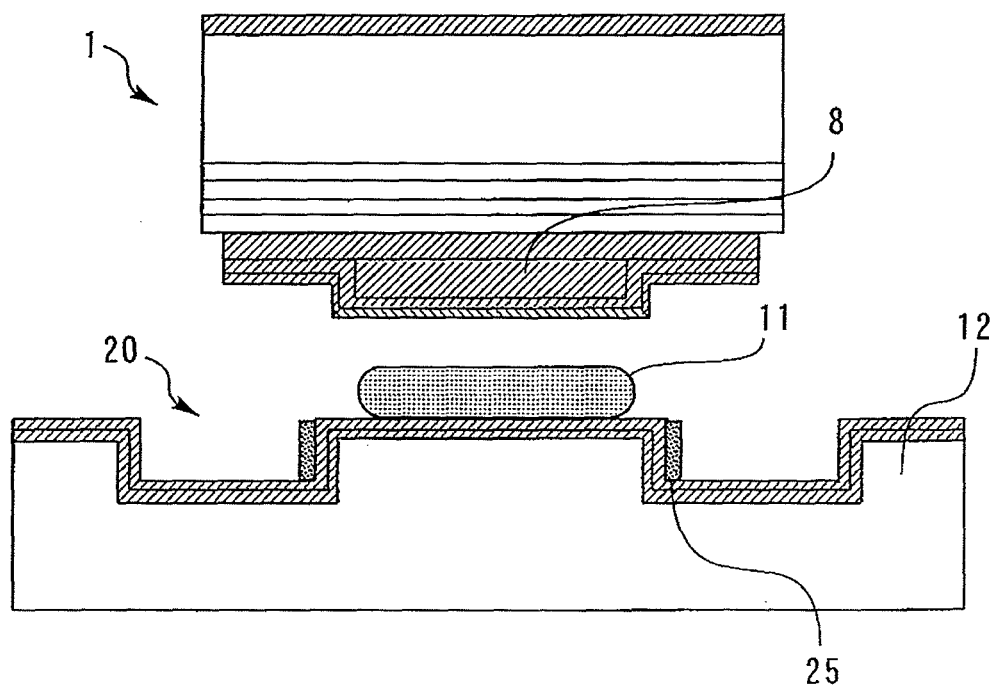
FIG. 15 is a sectional view for illustrating a method for manufacturing a semiconductor device according to the sixth embodiment.

FIG. 15 is a sectional view for illustrating a method for manufacturing a semiconductor device according to the sixth embodiment. First, a semiconductor laser 1 containing a p-n junction is prepared. Next, a channel 20 is formed so as to surround the joining region 18 on the submount 12, and an attractive material 25 is formed on the inner side surface of the channel 20. Then, the solder 11 is formed in the joining region 18 on the submount 12. Thereafter, the semiconductor laser 1 is mounted in the joining region 18 on the submount 12 via the solder 11 by a junction-down manner.

During this mounting, if the attractive material 25 is mixed in the solder 11, the fluidity of the solder 11 is improved. Thereby, the solder 11 easily flows into the channel 20. Therefore, since the solder 11 is prevented from wrapping around the side surface of the semiconductor laser 1 to cause the short-circuiting of the p-n junction, the yield can be improved. In addition, when the attractive material 25 is thinner, the excessive solder 11 easier flows into the channel 20. Also the area of the attractive material 25 is larger, the more solder 11 can be attracted.

Figure 16:
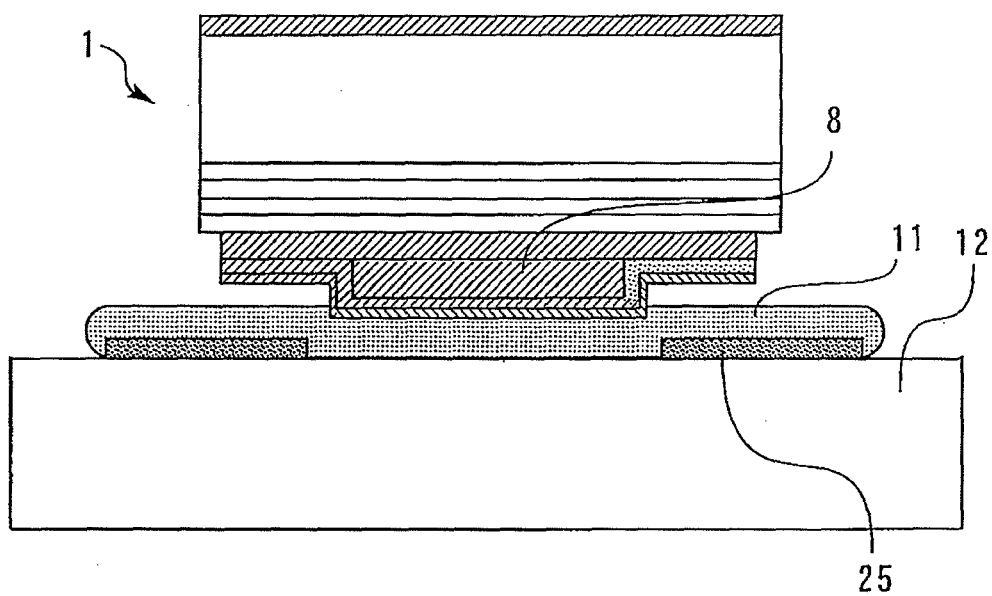
FIG. 16 is a sectional view showing a modification example of a semiconductor device according to the sixth embodiment.

FIG. 16 is a sectional view showing a modification example of a semiconductor device according to the sixth embodiment. The channel 20 is not formed in the submount 12. The attractive material 25 that facilitates the fusion of the solder 11 is formed on the flat submount 12 so as to surround the electrode 8. In this case also, since the solder 11 is easier laterally spread on the submount 12 by the attractive material 25, and the solder 11 is not built up, the equivalent effect can be obtained.

Seventh Embodiment

Figure 17:
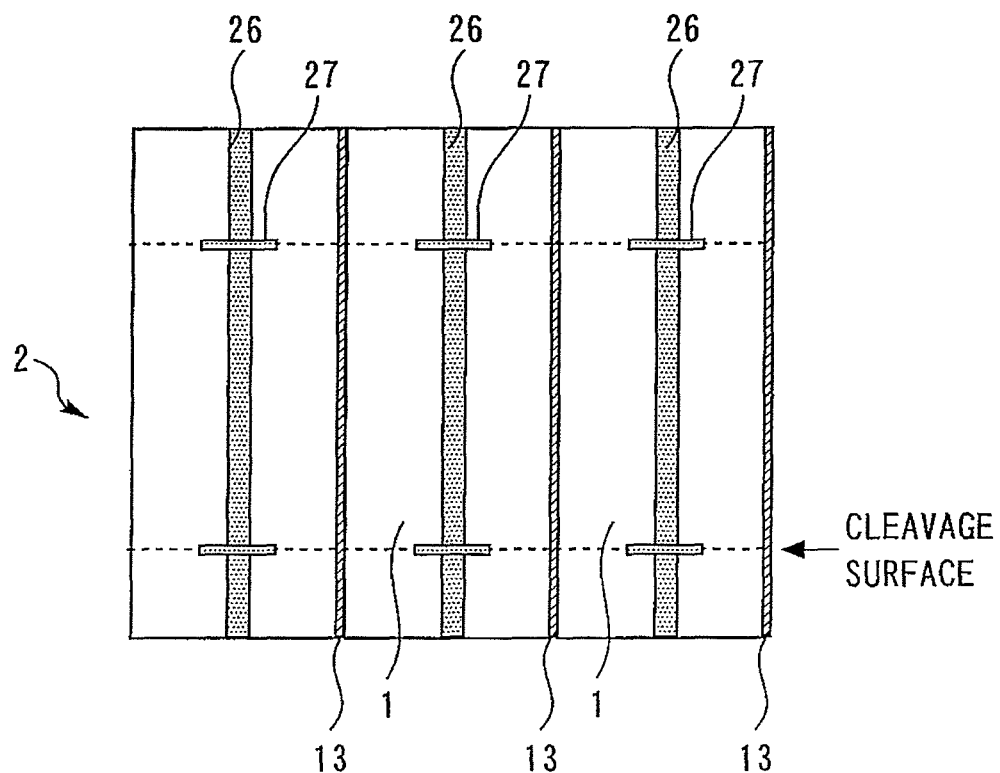
FIG. 17 is a top view showing a method for manufacturing a semiconductor device according to the seventh embodiment.
Figure 18:
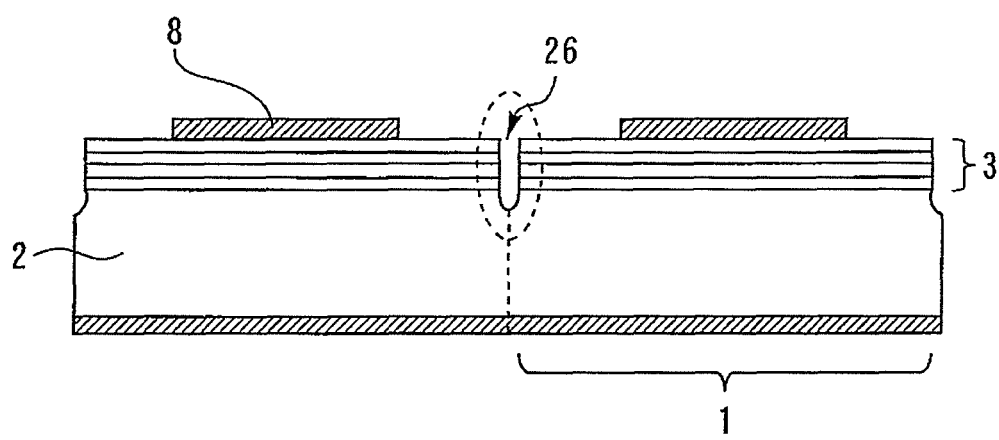
FIG. 18 is a sectional view thereof.
Figure 19:
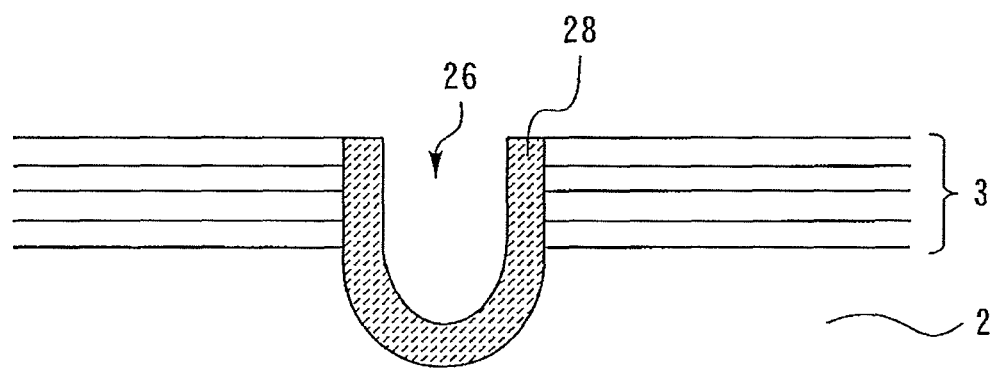
FIG. 19 is an enlarged sectional view of the part surrounded by broken lines in FIG. 18.

FIG. 17 is a top view showing a method for manufacturing a semiconductor device according to the seventh embodiment; and FIG. 18 is a sectional view thereof. FIG. 19 is an enlarged sectional view of the part surrounded by broken lines in FIG. 18.

First, a plurality of semiconductor laser 1 each having a semiconductor laminated structure 3 containing a p-n junction and an electrode 8 on the semiconductor laminated structure 3 are formed on a wafer-shaped n-type GaN substrate 2.

Next, as shown in FIGS. 17 and 18, the interface of the adjoining semiconductor lasers 1 is scribed by laser scribing to form the channels 26 and 27 deeper than the p-n junction. Specifically, a photoresist (not shown) is applied before forming the channels 26 and 27, and the photoresist on the area where the channels 26 and 27 are formed is removed by patterning. In addition, since the light-emitting regions 13 of the semiconductor lasers 1 must expose the cleavage surfaces, the channels 27 for cleavage are formed avoiding the light-emitting regions 13.

Next, as shown in FIG. 19, a resistance elevating treatment is carried out by a thermal oxidation method, which is a heat treatment for a long time, on the internal surfaces of the channels 26 and 27 to form a resistance elevated region 28. Thereafter, the photoresist is removed. In the case of a GaN-based material, the internal surfaces of the channels 26 and 27 have become a Ga-rich state wherein nitrogen on the GaN surface is escaped due to laser scribing. Therefore, the internal surfaces become GaO by thermal oxidation, and the resistance can be easily elevated. Alternatively, ion implantation wherein ions such as H (proton), F, O, Fe, Zn, and Si are implanted can also be performed as a resistance elevating treatment.

Next, cleavage or the like is carried out along the channels 26 and 27 for separating into individual semiconductor lasers 1. Then, the semiconductor laser 1 is mounted on the submount 12 via the solder 11 by a junction-down manner.

As described above, since the resistance elevating treatment is carried out on the internal surface of the channels 26 and 27, the resistance elevated region 28 has been formed on the side surface of the semiconductor laser 1. Therefore, since the solder 11 is prevented from wrapping around the side surface of the semiconductor laser 1 to reach the p-n junction and cause the short-circuiting of the p-n junction, the yield can be improved.

Generally, since the cleavage surface is protected by coating, no p-n junction is exposed. Therefore, the above-described resistance elevating treatment is not required. Furthermore, although laser scribing was used to both the channel 26 for separating and the channel 27 for cleavage, laser scribing may be used only to the channel 26 for separating, Laser scribing excels in fine processing compared with needle scribing, and working speed is high. Laser scribing also excels in process controllability compared with etching, deep scribing is feasible. Especially, since there is no suitable etchant is available for GaN-based semiconductor laser, and wet etching is difficult, laser scribing or dry etching is required.

Figure 20:
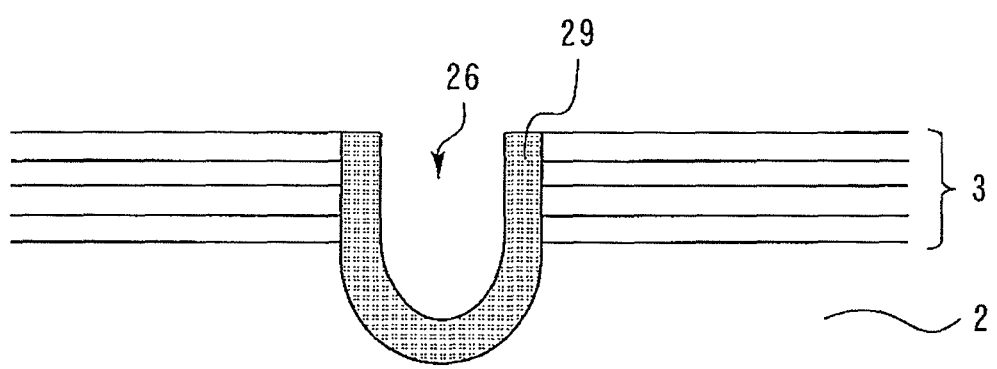
FIG. 20 is an enlarged sectional view showing a modification example of a method for manufacturing a semiconductor device according to the seventh embodiment.

FIG. 20 is an enlarged sectional view showing a modification example of a method for manufacturing a semiconductor device according to the seventh embodiment. Although a resistance elevating treatment was carried out on the inner surface of the channels 26 and 27 in the above-described example, the insulating film 29 is formed in the channels 26 and 27 in the modification example. Thereby, the equivalent effect can be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-088912, filed on Apr. 7, 2010 including specification, claims, drawings and summary, on which the Convention priority of the present application is based, are incorporated herein by reference in its entirety.

What is claimed is:

1. A semiconductor device comprising:
   a semiconductor laser including
      a semiconductor substrate,
      a semiconductor laminated structure having opposed first and second surfaces, and containing a p-n junction, wherein the first surface of the semiconductor laminated structure is disposed on the semiconductor substrate,
      an electrode disposed on and covering only part of the second surface of the semiconductor laminated structure, and
      a high-melting-point metal film disposed on and in direct contact with part of the second surface of the semiconductor laminated structure, and surrounding and disposed on a peripheral part of the electrode, wherein the high-melting-point metal film is chosen from the group consisting of platinum, nickel, nickel-chromium alloy, tungsten, titanium, tungsten-titanium alloy, molybdenum, tantalum, and niobium; and a submount, wherein the semiconductor laser is mounted on the submount via solder, in a junction-down manner, with the solder interposed between the submount and the electrode, and between the high-melting-point metal film and the submount, with the high-melting-point metal film surrounding the electrode, whereby the high-melting-point metal film prevents the solder from short circuiting the p-n junction.

2. The semiconductor device according to claim 1, wherein the semiconductor laminated structure has a channel surrounding the electrode, an inside surface of the channel is coated with the high-melting-point metal or dielectric film, and the high-melting-point metal film is not ohmically joined to the semiconductor laminated structure.

3. The semiconductor device according to claim 1, wherein the solder is chosen from the group consisting of solders that form Au—Sn-based alloys, Sn—Ag-based alloys, Sn—Ag—Cu-based alloys, Sn—Zn-based alloys, Sn—Bi-based alloys, Pb—Sn-based alloys, Au—Si-based alloys, and Au=Ge-based alloys.

* * * * *